United States Patent
Xie (10) Patent No.: US 10,913,391 B2
(45) Date of Patent: Feb. 9, 2021

(54) HORN ASSEMBLY CONTROL METHOD AND VEHICLE

(71) Applicant: Beijing Xiaomi Mobile Software Co., Ltd., Beijing (CN)

(72) Inventor: Yan Xie, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/419,746

(22) Filed: May 22, 2019

(65) Prior Publication Data

US 2020/0055451 A1 Feb. 20, 2020

(30) Foreign Application Priority Data

Aug. 20, 2018 (CN) .......................... 2018 1 0950396

(51) Int. Cl.
*B60Q 9/00* (2006.01)
*B60Q 5/00* (2006.01)

(52) U.S. Cl.
CPC ............. *B60Q 9/007* (2013.01); *B60Q 5/006* (2013.01); *B60Q 9/005* (2013.01)

(58) Field of Classification Search
CPC ........ B60Q 5/005; B60Q 5/006; B60Q 9/007; B60Q 9/005; B60Q 5/00; H03G 3/3005; H04R 2430/20; H04R 3/12; H04R 1/403; H04R 2430/01; H04R 2499/13; H04R 9/02; H04R 9/06; H04R 2400/11

(Continued)

(56) References Cited

U.S. PATENT DOCUMENTS

| 2003/0006897 A1* | 1/2003 | Chapin .................... B60Q 1/54 340/466 |
| 2011/0093149 A1* | 4/2011 | Tanaka .................. B60Q 5/008 701/22 |

(Continued)

FOREIGN PATENT DOCUMENTS

| CN | 1700808 A | 11/2005 |
| CN | 202243173 U | 5/2012 |

(Continued)

OTHER PUBLICATIONS

First Office Action issued by the State Intellectual Property Office (SIPO) of the People's Republic of China dated Dec. 30, 2019, in counterpart Chinese Application No. 201810950396.4.

(Continued)

*Primary Examiner* — Brian Wilson
(74) *Attorney, Agent, or Firm* — Finnegan, Henderson, Farabow, Garrett & Dunner, L.L.P.

(57) ABSTRACT

Disclosed are a method for controlling a horn assembly, a vehicle and a computer-readable storage medium. The horn assembly includes multiple horns mounted in different regions of transportation means. The method includes that: acquiring running information of the transportation means; selecting at least one of the regions in the transportation means as a related region according to the running information and determining a horn mounted in the related region as a main horn; and determining a sounding manner for the main horn according to the running information, the sounding manner including at least one of a sounding type or a sounding volume.

14 Claims, 6 Drawing Sheets

(58) Field of Classification Search
USPC .......................................... 340/384.1–404.3
See application file for complete search history.

(56) References Cited

U.S. PATENT DOCUMENTS

| | | | | |
|---|---|---|---|---|
| 2014/0015659 | A1* | 1/2014 | Tetsuka | B62M 9/122 |
| | | | | 340/432 |
| 2016/0167648 | A1* | 6/2016 | James | G06F 3/017 |
| | | | | 701/28 |
| 2016/0355179 | A1* | 12/2016 | Cannella | B60Q 9/008 |
| 2018/0208112 | A1* | 7/2018 | Tayama | B60Q 5/00 |

FOREIGN PATENT DOCUMENTS

| | | |
|---|---|---|
| CN | 103568941 A | 2/2014 |
| CN | 204575851 U | 8/2015 |
| CN | 104943605 A | 9/2015 |
| CN | 105383377 A | 3/2016 |
| CN | 105438063 A | 3/2016 |
| CN | 106671873 A | 5/2017 |
| CN | 206623751 U | 11/2017 |
| JP | 49-113563 U | 9/1974 |
| JP | 11-334468 A | 12/1999 |
| JP | 2005333573 A | 12/2005 |
| JP | 2009-107373 A | 5/2009 |
| JP | 2011-037420 A | 2/2011 |
| JP | 2011162073 A | 8/2011 |
| JP | 4811076 B2 | 11/2011 |
| JP | 2014196024 A * | 10/2014 |
| JP | 201724538 A | 2/2017 |
| KR | 20040098268 A | 11/2004 |

OTHER PUBLICATIONS

Korean Office Action dated Jul. 21, 2020, in counterpart Korean Application No. 10-2019-7026211.
Japanese Office Action dated Nov. 17, 2020, in counterpart Japanese Application No. 2019-550712.

* cited by examiner

HORN ASSEMBLY CONTROL METHOD AND VEHICLE

CROSS-REFERENCE TO RELATED APPLICATION

This application is based upon and claims priority to Chinese patent application No. 201810950396.4, filed on Aug. 20, 2018, the entire contents of which are incorporated herein by reference.

TECHNICAL FIELD

The present disclosure generally relates to the technical field of vehicles, and more particularly, to a method for controlling a horn assembly and a vehicle.

BACKGROUND

During use of transportation means such as a vehicle, a horn assembly has a warning function in the running of the transportation means, and the effective use of the horn assembly may greatly improve safety in use of the transportation means. However, a setting and control manner for the horn assembly usually directly influences a warning effect and intelligence in use thereof. Therefore, how to set and control a horn assembly becomes a research hot issue in this field.

SUMMARY

According to a first aspect of embodiments of the present disclosure, there is provided a method for controlling a horn assembly of transportation means, the horn assembly including multiple horns mounted in different regions of the transportation means. The method includes: acquiring running information of the transportation means; selecting at least one of the regions in the transportation means as a related region according to the running information and determining a horn mounted in the related region as a main horn; and determining a sounding manner for the main horn according to the running information, the sounding manner including at least one of a sounding type or a sounding volume.

According to a second aspect of embodiments of the present disclosure, a vehicle includes a horn assembly including multiple horns mounted in different regions of the vehicle; and a processor being electrically connected with each horn and configured to perform: acquiring running information of the vehicle; selecting at least one of the regions in the vehicle as a related region according to the running information and determining a horn mounted in the related region as a main horn; and determining a sounding manner for the main horn according to the running information, the sounding manner including at least one of a sounding type or a sounding volume.

According to a third aspect of embodiments of the present disclosure, a non-transitory computer-readable storage medium is provided, the storage medium having stored therein computer instructions that, when executed by a processor, cause the processor to perform the method for controlling a horn assembly according to the first aspect.

It is to be understood that the foregoing general description and the following detailed description are exemplary and explanatory only and not intended to limit the present disclosure.

BRIEF DESCRIPTION OF THE DRAWINGS

The accompanying drawings, which are incorporated in and constitute a part of this specification, illustrate aspects consistent with the present disclosure and, together with the description, serve to explain the principles of the present disclosure.

DETAILED DESCRIPTION

Reference will now be made in detail to embodiments, examples of which are illustrated in the accompanying drawings. The following description refers to the accompanying drawings in which the same numbers in different drawings represent the same or similar elements unless otherwise represented. The implementations set forth in the following description are exemplary and do not represent all implementations consistent with the present disclosure. Instead, they are merely examples of apparatuses and methods consistent with aspects of the present disclosure.

A horn assembly, which may be a speaker, and a control method thereof in the present disclosure may be applied to various types of transportation means with a sounding requirement, for example, an electric vehicle, an automobile, a motorcycle, a bicycle, a train, a ship and the like. The exemplary embodiments described below take an automobile as an example of the transportation means for illustrative purposes only.

Figure 1:
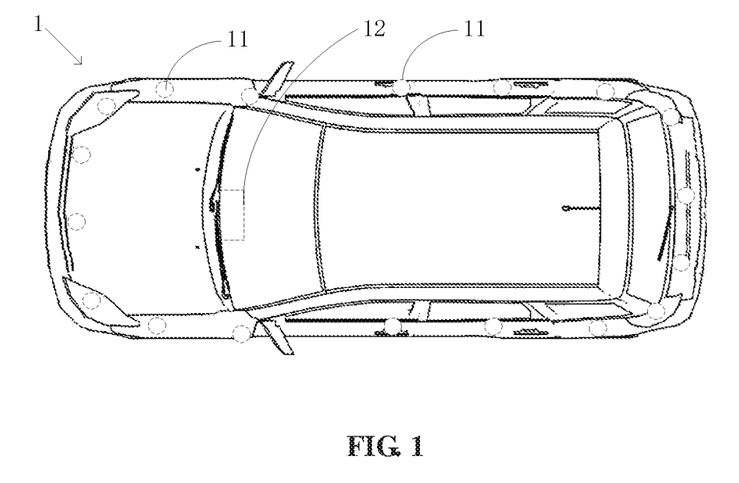
FIG. 1 is a schematic diagram of an automobile according to an exemplary embodiment.

FIG. 1 is a schematic diagram of an automobile 1 according to an exemplary embodiment of the present disclosure. As shown in FIG. 1, the automobile 1 includes a horn assembly and a processor 12. The horn assembly includes multiple horns 11 and each horn 11 is mounted in different regions of the automobile 1. The processor 12 is electrically connected with each horn 11 and is configured to select the horn 11 in at least one of matched regions as a main horn according to running information of the automobile 1 and select a sounding manner for the main horn according to the running information. The multiple horns 11 are assembled in different regions on lateral surfaces of the automobile 1 and surround the automobile 1. Through such a structural setting, the horn 11, in a matched region, of the horn assembly may be selected to sound for warning in a corresponding manner according to a running requirement, and a warning effect and intelligence in use of the horn assembly of the automobile 1 are improved.

It is to be noted that the horns 11 may be uniformly distributed on each lateral surface of the automobile 1 for the processor 12 to partition and select according to the running information. The horns 11 may also be distributed in a region frequently used during running to reduce the number of the horns 11 and reduce cost. For example, the horns 11 are distributed at the front and back of the automobile 1 to warn and prompt pedestrians and vehicles before or behind in a running process.

Figure 2:
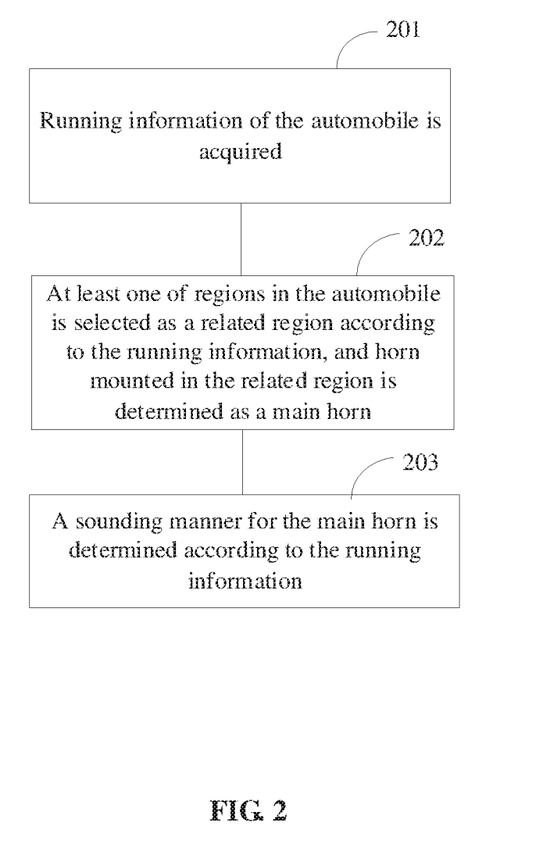
FIG. 2 is a flow chart of a method for controlling a horn assembly according to an exemplary embodiment.

FIG. 2 is a flowchart of a method for controlling a horn assembly according to an exemplary embodiment of the present disclosure. As shown in FIG. 2, the method for controlling a horn assembly may be executed by the processor 12 (FIG. 1) and implemented through the following operations.

In 201, running information of the automobile 1 is acquired.

In 202, at least one of regions in the automobile 1 is selected as a related region according to the running information, and a horn 11 mounted in the related region is determined as a main horn.

In 203, a sounding manner for the main horn is determined according to the running information, the sounding manner including at least one of a sounding type or a sounding volume.

According to the control method, the horn 11, in a matched region, of the horn assembly may be selected to sound for warning in a corresponding manner according to a running requirement, and a warning effect and intelligence in use of the horn assembly of the automobile 1 are improved.

In the above illustrated embodiment, after the main horn and the sounding manner thereof are determined according to the running information, the main horn may be controlled to independently sound for warning to reduce interference of sounding of the horn 11 in another region on the automobile 1 to pedestrians and vehicles in this region. Other horns 11 except the main horn may also be controlled to sound together with the main horn and, in such case, a sounding volume and tone of the other horns 11 may be controlled to be lower than the sounding volume and the tone of the main horn, to realize a warning function and simultaneously reduce interference of the other horns 11 to pedestrians and vehicles in the corresponding region.

Figure 3:
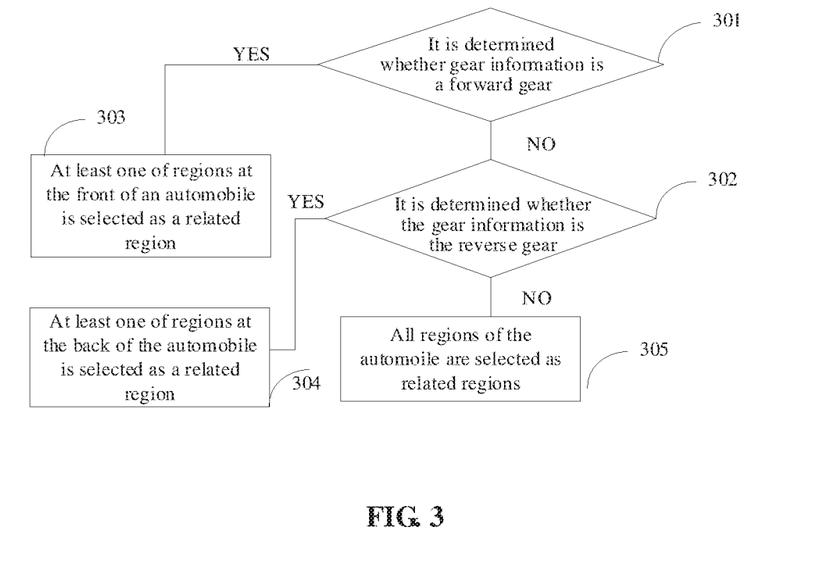
FIG. 3 is a flow chart of a method for controlling a horn assembly according to another exemplary embodiment.

The running information of the automobile 1 may be set according to a user requirement, a running road condition or a running state of the automobile 1. In an embodiment, in a smooth running process of the automobile 1 on a road section with a relatively good road condition, the main horn may be selected according to gear information of the automobile 1 and the sounding manner thereof is determined. For example, as shown in FIG. 3, the operation 202 (FIG. 2) that the at least one of regions in the automobile 1 is selected as a related region according to the running information and the horn 11 mounted in the related region is determined as the main horn may further be implemented through the following operations.

In 301, it is determined whether the gear information is a forward gear, at least one of regions at the front of the automobile 1 is selected as a related region in 303 responsive to determining that the gear information is the forward gear, and the operation in 302 is executed responsive to determining that the gear information is not the forward gear.

In 302, it is determined whether the gear information is a reverse gear, at least one of regions at the back of the automobile 1 is selected as a related region in 304 responsive to determining that the gear information is the reverse gear, and all regions in the automobile 1 are selected as related regions in 305 responsive to determining that the gear information is not the reverse gear.

When it is determined that the automobile 1 is at the forward gear, the automobile 1 moves forwards and the horn assembly is usually configured to prompt pedestrians or vehicles in front. In such case, the horn 11 at the front of the automobile 1 is selected as the main horn and sounds to achieve a relatively good prompting effect for the pedestrians or vehicles in front and simultaneously reduce interference to pedestrians or vehicles in other directions of the automobile 1. Similarly, when it is determined that the automobile 1 is at the reverse gear, the automobile 1 moves backwards, the horn 11 at the back of the automobile 1 is selected as the main horn and sounds to achieve a relatively good prompting effect for pedestrians or vehicles behind the automobile 1 and simultaneously reduce interference to pedestrians or vehicles in other directions of the automobile 1. Responsive to determining that the automobile 1 is not at the forward or reverse gear, the horns 11 in all the regions of the automobile 1 may be selected as main horns to prompt the pedestrians or vehicles around the automobile 1.

During use of the automobile 1, the gear information may be related to a running direction and a state thereof. Therefore, determining a position of the main horn according to the gear information is convenient and accurate.

In the above described embodiment, the sounding type and the sounding volume of the main horn may be determined according to a gear interval. For example, each horn 11 may configure with four volume intervals, i.e., a first volume interval, a second volume interval, a third volume interval, and a fourth volume interval ordered by volume from low to high. Meanwhile, each horn 11 may be configured with four sounding types, i.e., a soothing type, an ordinary type, a rapid type, and a shrill type ordered by tone from low to high. For example, for an automobile with a manual transmission, when the gear interval is neutral, the main horn is selected to sound for prompting with a soothing sound of which a volume is in the first volume interval. When the gear interval is from a first gear to a second gear, the main horn is selected to sound for prompting with an ordinary sound of which a volume is in the second volume interval. When the gear interval is from a third gear to a fourth gear, the main horn is selected to sound for prompting with a rapid sound of which a volume is in the third volume interval. When the gear interval is a fifth gear or above, the main horn is selected to sound for prompting with a shrill sound of which a volume is in the fourth volume interval.

It is to be noted that setting and configuration of the volume interval and sounding type of the horn 11 are not limited herein and may be made according to a practical requirement. A matching relationship among the volume interval, sounding type and gear interval of the horn 11 may also be set according to a user requirement and will not be limited in the present disclosure.

Figure 4:
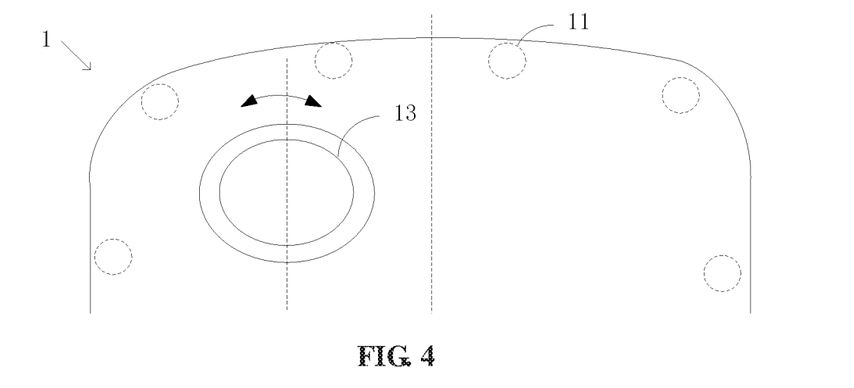
FIG. 4 is a schematic diagram of an automobile according to another exemplary embodiment.

In another embodiment, the main horn of the automobile 1 may also be selected through a rotation angle of a steering wheel 13. For example, during running in a zigzag road section, the main horn may be selected through the rotation angle of the steering wheel 13 of the automobile 1 and the sounding manner thereof is determined. For example, as shown in FIG. 4, a longitudinal centerline of the automobile 1 divides the automobile into left and right parts and multiple horns 11 are uniformly distributed on both of left and right sides of the automobile 1. The steering wheel 13 shown in the figure represents a spatial attitude of the steering wheel 13 in the automobile 1. When the automobile 1 runs forwards and the steering wheel 13 is rotated leftwards by 0-30 degrees, a first horn 11 arranged on the left side of the front of the automobile 1 is selected as the main horn and, sequentially, when the steering wheel 13 is rotated leftwards by 31-60 degrees, a second horn 11 arranged on the left side of the front of the automobile 1 is selected as the main horn. When the automobile 1 runs forwards and the steering wheel 13 is rotated rightwards, a same selection manner as that adopted during leftward rotation is adopted and will not be elaborated herein. It is to be noted that, when the automobile 1 runs backwards at the reverse gear, a horn 11 at a corresponding angle and position at the back of the automobile 1 is selected as the main horn, a selection principle for which is similar to the selection manner adopted when the automobile 1 runs forwards and will also not be elaborated herein.

A rotation direction of the steering wheel 13 of the automobile 1 is acquired to determine a running direction of the automobile 1, so that the horn 11 in a region corresponding to the running direction may be accurately selected for prompting and a prompting effect of the horn assembly for pedestrians and vehicles in the corresponding region is improved.

Figure 5:
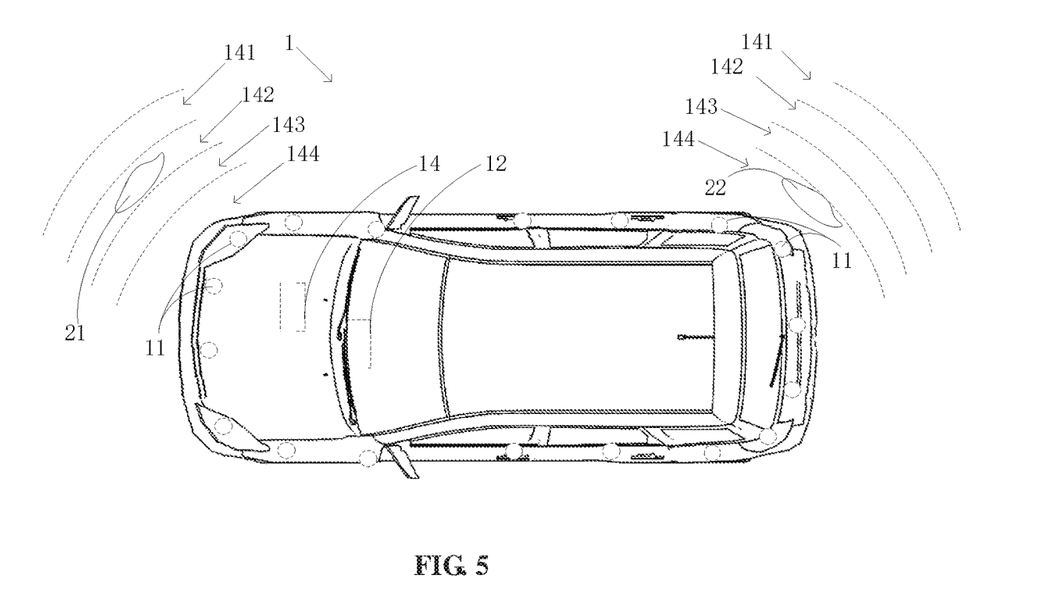
FIG. 5 is a schematic diagram of an automobile according to yet another exemplary embodiment.

In yet another embodiment, the main horn may be selected through position information of an obstacle encountered by the automobile 1 and a sounding manner thereof may be determined. As shown in FIG. 5, the automobile 1 is provided with a radar device 14 and the radar device 14 is configured to detect position information of obstacles around the automobile 1. After the radar device 14 acquires the position information of the obstacle, the horn 11 closest to the obstacle may be selected as the main horn. By such a method, accuracy of the position and region where the main horn is positioned and selected is improved, and the warning effect of the horn assembly is improved.

In an embodiment, the sounding type and sounding volume of the main horn may be determined according to a distance between the obstacle and the automobile 1. For example, each horn 11 may be configured with four volume intervals, i.e., a first volume interval, a second volume interval, a third volume interval, and a fourth volume interval ordered by volume from low to high. Meanwhile, each horn 11 may be configured with four sounding types, i.e., a soothing type, an ordinary type, a rapid type and a shrill type ordered by tone from low to high. The distance between the obstacle and the automobile 1 divides into four distance intervals, i.e., a first distance interval 141, a second distance interval 142, a third distance interval 143, and a fourth distance interval 144 ordered by distance from long to short. When the distance between the obstacle and the automobile 1 is in the first distance interval 141, the main horn is selected to sound for prompting with a soothing sound of which a volume is in the first volume interval. When the distance between the obstacle and the automobile 1 is in the second distance interval 142, the main horn is selected to sound for prompting with an ordinary sound of which a volume is in the second volume interval. When the distance between the obstacle and the automobile 1 is in the third distance interval 143, the main horn is selected to sound for prompting with a rapid sound of which a volume is in the third volume interval. When the distance between the obstacle and the automobile 1 is in the fourth distance interval 144, the main horn is selected to sound for prompting with a shrill sound of which a volume is in the fourth volume interval.

It is to be noted that a matching relationship among the volume interval and sounding type of the horn 11 and the distance between the obstacle and the automobile 1 as well as the first distance interval 141, the second distance interval 142, the third distance interval 143 and the fourth distance interval 144 may be set according to the user requirement, and will not be limited in the present disclosure.

In addition, the method for selecting the main horn and the sounding manner thereof may be independently implemented through one of the gear information, the rotation angle of the steering wheel 13 or the position information of the obstacle. Multiple pieces of running information such as the gear information, the rotation angle of the steering wheel 13 and the position information of the obstacle may also be combined for selection to improve the accuracy of the position of the main horn and suitability of the sounding manner.

In another embodiment, a direction and distance of the obstacle relative to the automobile 1 may be combined to determine the region, sounding type and volume of the main horn. For example, the radar device 14 monitors that there is a first obstacle 21 in front of the right part of the automobile 1, a distance between the first obstacle 21 and the automobile 1 is in the second distance interval 142, there is a second obstacle 22 behind the right part of the automobile 1 and a distance between the second obstacle 22 and the automobile 1 is in the fourth distance interval 144. According to the above running information of the automobile 1, two horns 11 corresponding to a position of the first obstacle 21 in front of the right part of the automobile 11 and two horns 11 corresponding to a position of the second obstacle 22 behind the right part may simultaneously selected as main horns. Sounding types and types of the main horns may be selected based on the above described method: the two main horns in the front right part of the automobile 1 sound for prompting with ordinary sounds of which volumes are in the second volume interval and the two horns in the rear right part of the automobile 1 sound for prompting with shrill sounds of which volumes are in the fourth volume interval.

It is to be noted that the direction and distance of the obstacle change in a dynamic running process of the automobile 1 and thus the region, sounding type and volume of the main horn on the automobile 1 may also change. The embodiment shown in FIG. 5 is an exemplary description and the main horn and the sounding type and volume thereof may be selected for information about the obstacle in a practical running process in the present disclosure.

The method for controlling a horn assembly executed by the processor 12 may also be implemented by acquiring information such as running time and running weather of the automobile 1, which are not limited in the present disclosure.

Figure 6:
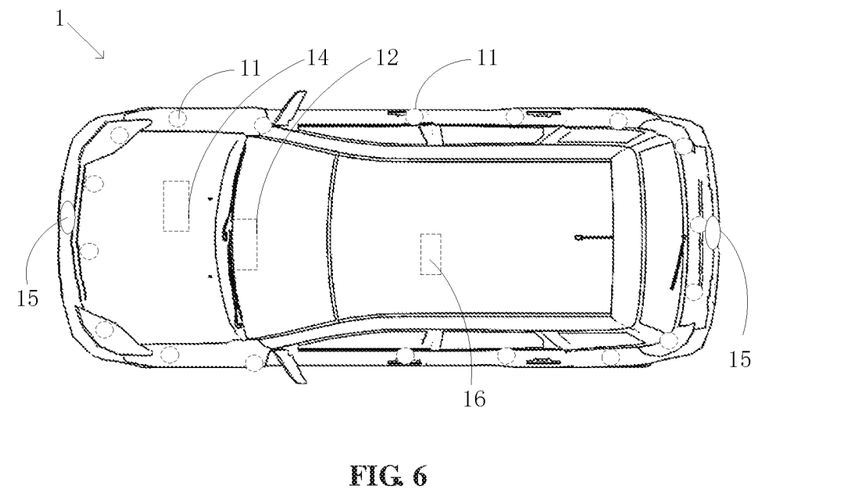
FIG. 6 is a schematic diagram of an automobile according to still another exemplary embodiment.

As shown in FIG. 6, the automobile 1 may further include a monitoring camera 15 connected with the processor 12. The monitoring camera 15 is arranged in at least one region of the front, back or lateral surfaces of the automobile 1 to monitor a road condition of the region and cooperates with the horn 11, serving as the main horn, of the region for warning and prompting. For example, when a vehicle to be prompted, acquired by the monitoring camera 15, in the region is a large truck, the main horn in the region is selected to sound for prompting with a shrill sound of which a volume is in the fourth volume interval; and when the vehicle to be prompted, acquired by the monitoring camera 15, in the region is small transportation means such as a motorcycle and a bicycle, the main horn in the region is selected to sound for prompting with a soothing sound of which a volume is in the first volume interval.

The automobile 1 may further include a positioning device 16 connected with the processor 12 and the positioning device 16 positions the automobile 1 and cooperates with the main horn for warning and prompting. For example, when a position, acquired by the positioning device 16, of the automobile 1 is a highway, the main horn in the region is selected to sound for prompting with a shrill sound of which a volume is in the fourth volume interval; and when the position, acquired by the positioning device 16, of the automobile 1 is a residential area, the main horn in the region is selected to sound for prompting with a soothing sound of which a volume is in the first volume interval.

In an embodiment, there is also provided a non-transitory computer-readable storage medium including instructions, such as a memory including instructions, which when executed by the processor 12, cause to implement the operations of the above described methods for controlling the horn assembly. For example, the non-transitory computer-readable storage medium may be a Read-Only Memory (ROM), a Compact Disc Read-Only Memory (CD-ROM), a magnetic tape, a floppy disc, an optical data storage device and the like.

Other implementation solutions of the present disclosure will be apparent to those skilled in the art from consideration of the specification and practice of the technical solutions disclosed herein. The present disclosure is intended to cover any variations, uses, or adaptations of the embodiments of the present disclosure following the general principles thereof and including such departures from the embodiments of the present disclosure as come within known or customary practice in the art. It is intended that the embodiments be considered as exemplary, with a true scope and spirit of the present disclosure being indicated by the following claims.

It will be appreciated that the present disclosure is not limited to the exact embodiments that have been described above and illustrated in the accompanying drawings, and that various modifications and changes may be made without departing from the scope thereof. It is intended that the scope of the present disclosure be limited by the appended claims.

According to the present disclosure, multiple horns of a horn assembly are assembled in different regions of transportation means, at least one of the regions in the transportation means is selected as a related region according to running information, and a sounding manner for a main horn mounted in the related region is determined according to the running information. Therefore, the horn, in a matched region, of the horn assembly may be selected to sound for warning in a corresponding manner according to a running requirement, and a warning effect and intelligence in use of the horn assembly of the transportation means are improved.

What is claimed is:

1. A method for controlling a horn assembly of a transportation means, wherein the horn assembly includes multiple horns mounted in different regions of the transportation means, the method comprising:
   acquiring running information of the transportation means;
   selecting at least one of the regions in the transportation means as a related region according to the running information, and determining a horn mounted in the related region as a main horn; and
   determining a sounding manner of the main horn matching the running information based on a preset matching relationship between the running information and the sounding manner, wherein the sounding manner includes at least one of a sounding type or a sounding volume,
   wherein the running information comprises gear information of the transportation means, and
   wherein selecting the at least one of the regions in the transportation means as the related region according to the running information comprises:
   determining whether the gear information is a forward gear or a reverse gear; and
   selecting all of the regions in the transportation means as the related region responsive to determining that the gear information is neither the forward gear nor the reverse gear.

2. The method of claim 1, further comprising:
   selecting at least one of the regions at the front of the transportation means as the related region responsive to determining that the gear information is the forward gear; or
   selecting at least one of the regions at the back of the transportation means as the related region responsive to determining that the gear information is the reverse gear.

3. The method of claim 1, wherein determining the sounding manner of the main horn matching the running information based on the preset matching relationship comprises:
   determining the sounding type and the sounding volume of the main horn according to a gear interval based on preset mapping relationships among gear intervals of the transportation means, sounding types, and volume intervals.

4. The method of claim 1, wherein the running information further comprises a rotation angle of a steering wheel of the transportation means.

5. The method of claim 1, wherein the running information further comprises position information of an obstacle encountered by the transportation means.

6. The method of claim 5, wherein determining the sounding manner of the main horn matching the running information based on the preset matching relationship comprises:
   determining a distance between the obstacle and the transportation means according to the position information of the obstacle; and
   determining the sounding type and the sounding volume of the main horn according to the distance based on preset mapping relationships among distances between the obstacle and the transportation means, volume intervals, and sounding types.

7. A vehicle, comprising:
   a horn assembly including multiple horns mounted in different regions of the vehicle; and
   a processor electrically connected with each horn, the processor being configured to perform:
   acquiring running information of the vehicle;
   selecting at least one of the regions in the vehicle as a related region according to the running information, and determining a horn mounted in the related region as a main horn; and
   determining a sounding manner of the main horn matching the running information based on a preset matching relationship between the running information and the sounding manner, wherein the sounding manner includes at least one of a sounding type or a sounding volume,
   wherein the running information comprises gear information of the vehicle, and
   wherein selecting the at least one of the regions in the vehicle as the related region according to the running information comprises:
   determining whether the gear information is a forward gear or a reverse gear; and
   selecting all of the regions in the vehicle as the related region responsive to determining that the gear information is neither the forward gear nor the reverse gear.

8. The vehicle of claim 7, wherein in selecting the at least one of the regions in the vehicle as the related region according to the running information, the processor is configured to perform:
 selecting at least one of the regions at the front of the vehicle as the related region responsive to determining that the gear information is the forward gear; or
 selecting at least one of the regions at the back of the vehicle as the related region responsive to determining that the gear information is the reverse gear.

9. The vehicle of claim 7, wherein determining the sounding manner of the main horn matching the running information based on the preset matching relationship comprises:
 determining the sounding type and the sounding volume of the main horn matching a gear interval based on preset mapping relationships among gear intervals of the vehicle, sounding types and volume intervals.

10. The vehicle of claim 7, wherein the running information further comprises a rotation angle of a steering wheel of the vehicle.

11. The vehicle of claim 7, wherein the running information further comprises position information of an obstacle encountered by the vehicle.

12. The vehicle of claim 11, wherein determining the sounding manner of the main horn matching the running information based on the preset matching relationship comprises:
 determining a distance between the obstacle and the vehicle according to the position information of the obstacle; and
 determining the sounding type and the sounding volume of the main horn matching the distance based on preset mapping relationships among distances between the obstacle and the vehicle, volume intervals and sounding types.

13. The vehicle of claim 7, wherein the multiple horns are assembled in the different regions on lateral surfaces of the vehicle and surround the vehicle.

14. A non-transitory computer-readable storage medium having stored therein computer-executable instructions that, when executed by a processor, cause the processor to perform a method for controlling a horn assembly of a transportation means, wherein the horn assembly includes multiple horns mounted in different regions of the transportation means, the method comprising:
 acquiring running information of the transportation means;
 selecting at least one of the regions in the transportation means as a related region according to the running information, and determining a horn mounted in the related region as a main horn; and
 determining a sounding manner of the main horn matching the running information based on a preset matching relationship between the running information and the sounding manner, wherein the sounding manner includes at least one of a sounding type or a sounding volume,
 wherein the running information comprises gear information of the transportation means, and
 wherein selecting the at least one of the regions in the transportation means as the related region according to the running information comprises:
  determining whether the gear information is a forward gear or a reverse gear; and
  selecting all of the regions in the transportation means as the related region responsive to determining that the gear information is neither the forward gear nor the reverse gear.

* * * * *